(12) United States Patent
Hurwitz et al.

(10) Patent No.: US 9,589,920 B2
(45) Date of Patent: Mar. 7, 2017

(54) CHIP PACKAGE

(71) Applicant: Zhuhai Advanced Chip Carriers & Electronic Substrate Solutions Technologies Co. Ltd., Zhuhai (CN)

(72) Inventors: Dror Hurwitz, Zhuhai (CN); Alex Huang, Zhuhai (CN)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 0 days.

(21) Appl. No.: 14/836,111

(22) Filed: Aug. 26, 2015

(65) Prior Publication Data

US 2017/0005058 A1    Jan. 5, 2017

Related U.S. Application Data

(63) Continuation-in-part of application No. 14/789,165, filed on Jul. 1, 2015.

(51) Int. Cl.
*H01L 23/31* (2006.01)
*H01L 23/00* (2006.01)
(Continued)

(52) U.S. Cl.
CPC .......... *H01L 24/16* (2013.01); *H01L 21/0273* (2013.01); *H01L 21/6835* (2013.01); *H01L 21/6836* (2013.01); *H01L 21/78* (2013.01); *H01L 23/291* (2013.01); *H01L 23/293* (2013.01); *H01L 23/3171* (2013.01); *H01L 23/49816* (2013.01); *H01L 23/49822* (2013.01); *H01L 23/49838* (2013.01); *H01L 23/49866* (2013.01); *H01L 24/08* (2013.01); *H01L 24/11* (2013.01); *H01L 24/95* (2013.01); *H01L 21/563* (2013.01); *H01L 23/13* (2013.01); *H01L 23/142* (2013.01); *H01L 23/3114* (2013.01); *H01L 23/49548* (2013.01); *H01L 23/49586* (2013.01); *H01L 2221/68327* (2013.01);
(Continued)

(58) Field of Classification Search
CPC ..... H01L 21/563; H01L 23/13; H01L 23/142; H01L 23/3114; H01L 23/49548; H01L 23/49586; H01L 23/49838
USPC .......................................................... 257/722
See application file for complete search history.

(56) References Cited

U.S. PATENT DOCUMENTS

2010/0000772 A1*  1/2010  Letterman, Jr. ....... H01L 21/561
                                                                174/260
2010/0207281 A1*  8/2010  Su ......................... H01L 21/563
                                                                257/786
(Continued)

*Primary Examiner* — George Fourson, III
(74) *Attorney, Agent, or Firm* — Wiggin and Dana LLP; Gregory S. Rosenblatt

(57) ABSTRACT

An embedded die package and method of manufacture, the die package comprising a die having I/O contact pads in a passivation layer wherein the die contact pads are coupled to a first side of a feature layer by an adhesion/barrier layer, and a layer of pillars extends from a second side of the feature layer, the die, feature layer and the layer of pillars being encapsulated by a dielectric material and wherein the feature layer comprises routing lines that are individually drawn by laser exposure of photoresist under guidance of an optical imaging system for good alignment with both the I/O contact pads of the die and with the subsequently to be deposited pillars that are positioned with respect to the package edges.

31 Claims, 11 Drawing Sheets

(51) Int. Cl.
*H01L 23/29* (2006.01)
*H01L 23/498* (2006.01)
*H01L 21/78* (2006.01)
*H01L 21/027* (2006.01)
*H01L 21/683* (2006.01)
*H01L 23/495* (2006.01)
*H01L 23/14* (2006.01)
*H01L 21/56* (2006.01)
*H01L 23/13* (2006.01)

(52) U.S. Cl.
CPC ............ *H01L 2221/68359* (2013.01); *H01L 2224/05124* (2013.01); *H01L 2224/11002* (2013.01); *H01L 2224/1182* (2013.01); *H01L 2224/11462* (2013.01); *H01L 2224/11614* (2013.01); *H01L 2224/11622* (2013.01); *H01L 2224/13013* (2013.01); *H01L 2224/13014* (2013.01); *H01L 2224/13016* (2013.01); *H01L 2224/13022* (2013.01); *H01L 2224/13023* (2013.01); *H01L 2224/13147* (2013.01); *H01L 2924/01022* (2013.01); *H01L 2924/01024* (2013.01); *H01L 2924/01028* (2013.01); *H01L 2924/01029* (2013.01); *H01L 2924/01046* (2013.01); *H01L 2924/01073* (2013.01); *H01L 2924/01074* (2013.01); *H01L 2924/01079* (2013.01); *H01L 2924/05042* (2013.01); *H01L 2924/07025* (2013.01); *H01L 2924/15311* (2013.01); *H01L 2924/15313* (2013.01); *H01L 2924/2064* (2013.01)

(56) References Cited

U.S. PATENT DOCUMENTS

| | | | | |
|---|---|---|---|---|
| 2012/0075807 A1* | 3/2012 | Refai-Ahmed | ......... | H01L 23/13 361/719 |
| 2012/0286408 A1* | 11/2012 | Warren | ............... | H01L 21/4832 257/673 |
| 2013/0075921 A1* | 3/2013 | Chen | ................. | H01L 23/49816 257/774 |
| 2014/0070406 A1* | 3/2014 | Mohammed | ........ | H01L 25/0652 257/737 |
| 2014/0117533 A1* | 5/2014 | Lei | .......... | H01L 24/03 257/737 |
| 2014/0134796 A1* | 5/2014 | Kelly | .................. | H01L 25/0655 438/107 |
| 2015/0021751 A1* | 1/2015 | Paek | ................. | H01L 23/49582 257/676 |
| 2015/0228561 A1* | 8/2015 | Lin | ................... | H01L 23/49541 257/676 |
| 2016/0064310 A1* | 3/2016 | Sirinorakul | ....... | H01L 23/49541 257/676 |
| 2016/0064315 A1* | 3/2016 | Wu | ......................... | H01L 24/81 361/783 |
| 2016/0066414 A1* | 3/2016 | Jow | .................. | H01L 23/49838 361/767 |

\* cited by examiner

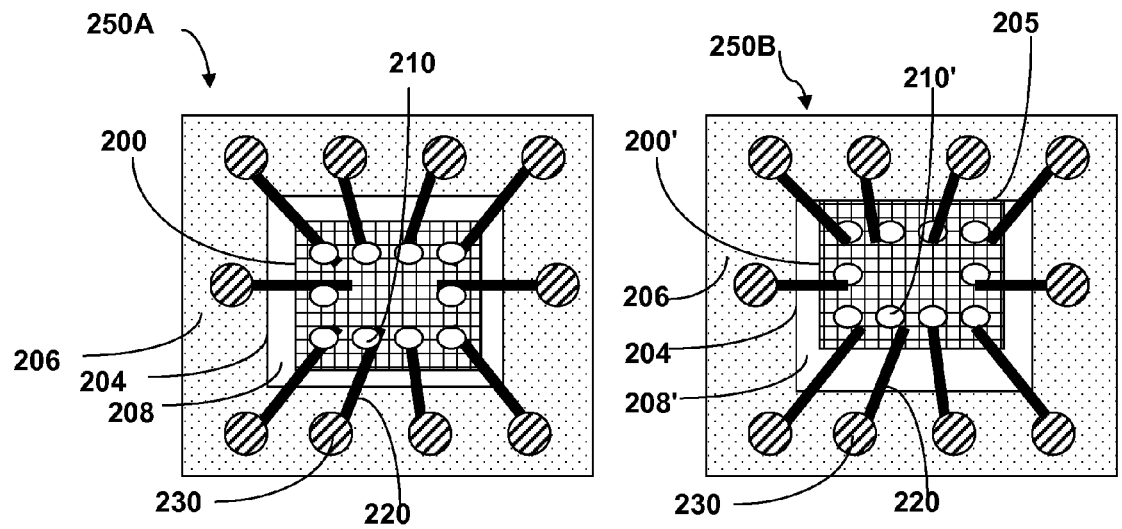
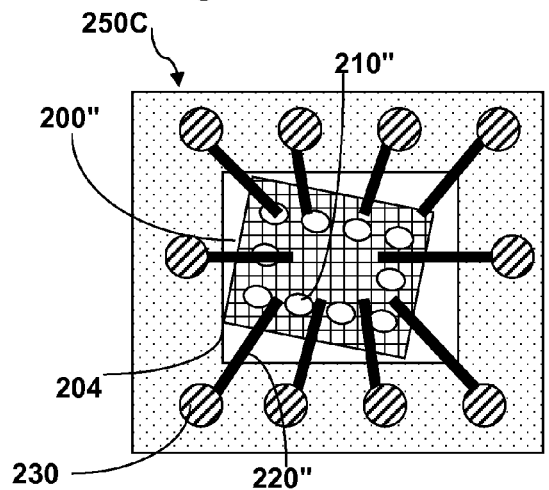

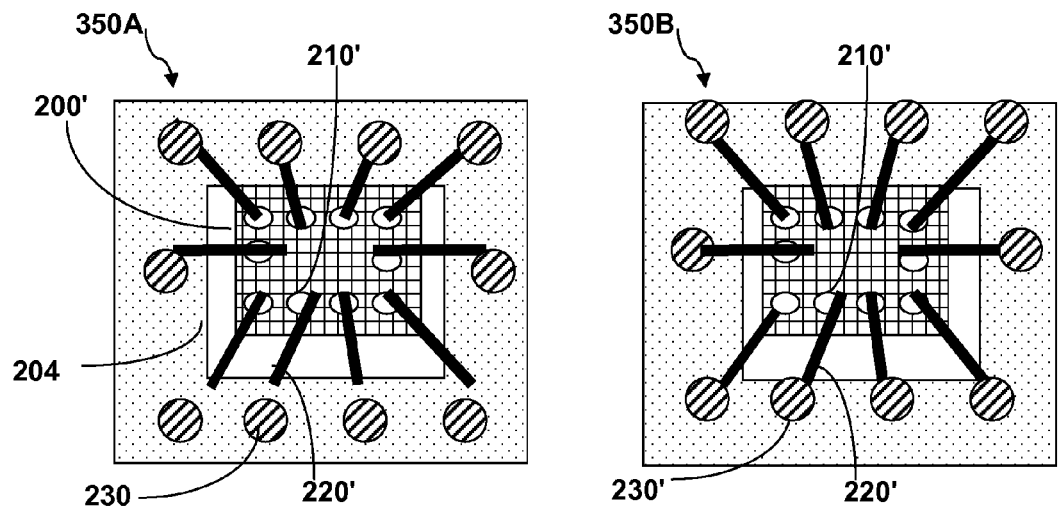
Fig. 4A
Fig. 4B
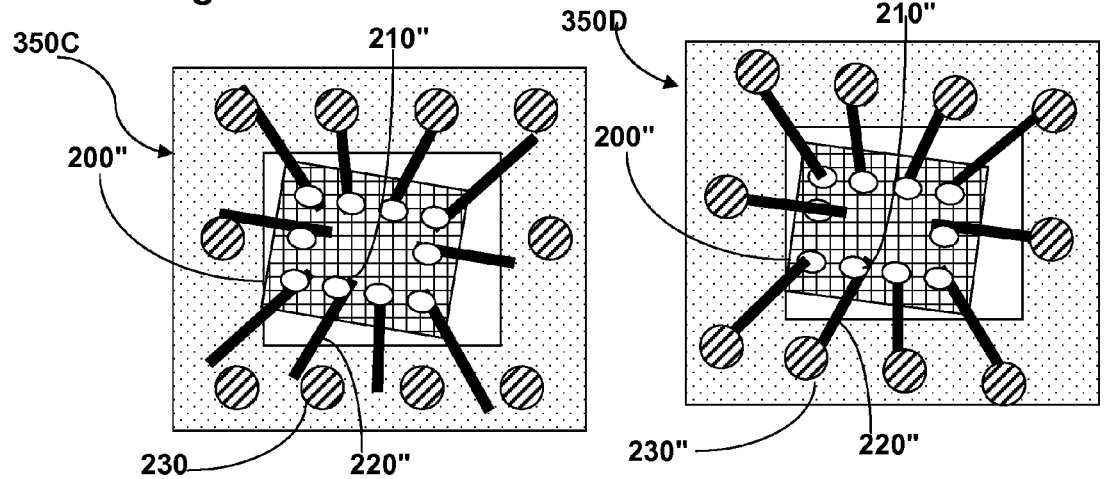
Fig. 4C
Fig. 4D

CHIP PACKAGE

CROSS REFERENCE TO RELATED APPLICATION

This application is a continuation-in-part application of U.S. patent application Ser. No. 14/789,165. The disclosure of U.S. Ser. No. 14/789,165 is hereby incorporated by reference herein in its entirety.

BACKGROUND

Field of the Invention

The present invention relates to electronic chip packaging and to methods of manufacturing of same.

Description of the Related Art

Consumer electronics such as computing and telecommunication devices include integrated circuit chips.

The classical approach for enabling the coupling of chips to the outside world is to include an IC substrate as part of the chip packaging. The packaged chip has connections such as a ball grid array BGA or a land grid array LGA for coupling to a printed circuit board PCB or other substrate to which other components are coupled.

The IC substrate is required to have high planarity and to be stiff and warp resistant to ensure good contact with PCBs and other underlying substrates. The general requirement for IC substrates in particular and for chip packaging in general is reliability and appropriate electrical performance, thinness, stiffness, planarity, good heat dissipation and a competitive unit price.

A well established common type of chip package that is comparatively cheap and enables IC circuits to communicate with the outside world is the lead frame. The lead frame uses metal leads that extend outside the housing. Lead frame technology goes back to the early days of DIP chips, but is still widely used in many package varieties.

The lead frame serves as the 'skeleton' of the IC package, providing mechanical support to the die during its assembly into a finished product. It consists of a die paddle, to which the die is attached, and leads, which serve as the means for external electrical connection to the outside world. The die is connected to the leads by wires through wire bonding or by tape automated bonds.

Once attached to the lead frame with the connecting wires, the die or chip is covered with a plastic protective material that is known as a molding compound.

Technologies that are used for fabricating more advanced multilayer substrates comprise layers of connecting pads or features embedded within dielectric material. Vias are provided through the dielectric material to electronically couple together features in different layers.

One method for fabricating such vias is by drill & fill, wherein holes are drilled through the dielectric, typically using a laser, and a conductive material, such as copper is used to fill the hole, creating a via.

An alternative approach to fabricate vias is by depositing copper or other metal into a pattern created in a photo-resist by selective exposure to light of an appropriate wavelength, typically ultraviolet, either by selective exposure to a lamp through a stencil or by writing the pattern using a laser scribe. This technology of electroplating into a pattern developed into a photo-resist is known as 'pattern plating'. The photo-resist is subsequently removed and the upstanding via posts are laminated with a dielectric material that is preferably a polymer impregnated glass fiber mat pre-preg for enhanced stiffness.

In pattern plating, a seed layer is first deposited. Then a layer of photo-resist is deposited thereover and subsequently exposed to create a pattern which is selectively removed to make trenches that expose the seed layer. Via posts are created by depositing copper into the trenches in the photo-resist. The remaining photo-resist is then removed, the seed layer is etched away, and a dielectric material that is, again, typically a polymer impregnated glass fiber mat prepreg, is laminated thereover and therearound to encase the vias posts. Various techniques and processes can be then use to thin down the dielectric material, planarizing it and exposing the tops of the via posts allowing conductive connection to a ground or reference plane thereby, for building up the next metal layer thereupon. Subsequent layers of metal conductors and via posts may be deposited thereonto, by repeating the process to build up a desired multilayer structure.

In an alternative but closely linked technology, known hereinafter as 'panel plating', a continuous layer of metal or alloy is deposited onto a substrate. A layer of photo-resist is deposited on top of this and a pattern is developed within the photo-resist. Subsequently the developed photo-resist is selectively stripped away, selectively exposing the metal thereunder, which may then be etched away. The undeveloped photo-resist protects the underlying metal from being etched away, and leaves a pattern of upstanding features and vias. After stripping away the undeveloped photo-resist, a dielectric material, such as a polymer impregnated glass fiber mat, may be laminated around and over the upstanding copper features and/or via posts. In yet other variants, a pattern of undeveloped photoresist is stripped away leaving the developed photoresist to act as a mask.

The via layers created by pattern plating or panel plating methodologies such as those described above, are typically known as 'via posts'. Feature layers may be fabricated using similar techniques.

One flexible technology for fabricating high density interconnects is to build up pattern or panel plated multilayer structures consisting of metal vias or features in a dielectric matrix. The metal used for the vias and features may be copper, and the dielectric may consist of a fiber reinforced polymer matrix. Typically, a polymer with a high glass transition temperature ($T_g$) is used, such as polyimide, for example. These interconnects may be cored or coreless, and may include cavities for stacking components. They may have odd or even numbers of layers. Enabling technology is described in previous patents issued to Amitec-Advanced Multilayer Interconnect Technologies Ltd. For example, U.S. Pat. No. 7,682,972 to Hurwitz et al. titled "Advanced Multilayer Coreless Support Structures and Method for their Fabrication" describes a method of fabricating a free standing membrane including a via array in a dielectric, for use as a precursor in the construction of superior electronic support structures. The method includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,635,641 to Hurwitz et al. titled "Integrated Circuit Support Structures and their Fabrication" describes a method of fabricating an electronic substrate comprising the steps of; (A) selecting a first base layer; (B) depositing a first etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photo-resist to the second base layer; (F) etching away the first base layer; (G) removing the protective coating of photo-resist; (H) removing the first etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second hall stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

Multilayer substrates enable a higher density of connections and are used with ever more sophisticated IC chips. They are more expensive than simple single layer lead frames, and for many electronic applications, the more economical lead frame is suitable.

Even for packaging relatively simple chips where a single layer is adequate, lead frame technology has its limitations. The chip is attached to the lead frame by wire bonding and the longer the connecting wires, the greater the danger of a wire breaking, creating a disconnect and leading to failure. Additionally, the closer the wires are packed together, the greater the likelihood of shorting.

The via post in dielectric material approach is suitable for multilayer substrates but is generally too flimsy to be used in single layer structures, since it will be appreciated that warping and bending create poor contacts, unreliability and shorting.

U.S. Pat. No. 8,866,286 to Hurwitz et al. titled "Single Layer Coreless Substrate" describes an electronic chip package comprising at least one chip bonded to a routing layer of an interposer comprising a routing layer and a via post layer, wherein the via post layer is surrounded by a dielectric material comprising glass fibers in a polymer resin, and the chip and routing layer are embedded in a second layer of dielectric material encapsulating the chip and the routing layers. In this packaging technology, the copper ends of the via posts are flush with the dielectric material.

The package is fairly robust but may be subject to over-heating. Additionally, such packages may have stray inductances due to the wire bonds and may be costly to manufacture due to the assembly processes and materials required for the die-attachment, the wire-bonding and molding.

Co-pending application number U.S. Ser. No. 14/789,165 describes an embedded die package comprising a die having die contact pads in a passivation layer, the die contact pads being coupled to a first side of a feature layer by an adhesion/barrier layer, pillars extending from a second side of the feature layer, the die, feature layer and pillars being encapsulated by a dielectric material.

Also described therein, is a method for fabricating such structures consisting of:

Obtaining a grid of sockets surrounded by a polymer frame;

Placing the grid of chip sockets on a tape;

Placing chips face down (flip chip) in the sockets of the grid;

Laminating a dielectric material over the dies and the grid;

Applying a carrier over the dielectric;

Depositing an adhesive layer comprising at least one of titanium, tantalum, tungsten, chrome and/or nickel followed by a seed layer of copper onto newly exposed surface;

Applying a layer of first layer of photoresist and develop a pattern with a feature layer.

Electroplating copper into the pattern to form features;

Stripping away the first layer of photoresist;

Applying a second layer of photoresist patterned with a pattern of via pillars;

Electroplating copper into the pattern to form via pillars;

Stripping away the second layer of photoresist;

Etching away exposed portions of the adhesive layer and the copper seed layer;

Applying a dielectric barrier layer covering the copper features, pillars and undersides of the chips;

Removing carrier;

Laminating a thin layer of black dielectric over the back of the array of dies;

Thinning the dielectric to expose the copper pillars;

Applying terminations, and

Dicing the grid into individual packaged chips.

The method is a build up method. The routing tracks of the feature layer are deposited over the pads of the embedded chip and after lamination of these routing tracks, the pads are created as a further layer which is then laminated the pads are then terminated as a Land Grid Array or as a Ball Grid Array.

In consequence of the layered manufacturing technique of this packaging technique as previously disclosed, there is a problem of alignment that may reduce yields and thus increase unit cost, or, to enable high yields despite the alignment issue, may limit the applicability of the technique to the packaging relatively simple and large dies with few terminations. Where an array of dies is processed simultaneously, each die is positioned in its socket and, after lamination; a feature layer consisting of routing lines is applied to the entire array. The sockets have to be larger than the dice, i.e. clearance is required for positioning the dice. Typically, the manufacturing tolerance is ±10 microns for the socket if it is formed by dissolution of sacrificial copper, and ±5 microns for the dice which are cut from a wafer, and the cutting technology, whether laser or blade, has its inherent variations. In addition to the manufacturing tolerances of the die dimensions and the manufacturing tolerances of the sockets, for picking and placing the dice into the sockets a clearance is required. Consequently, the individual sockets have to be a minimum of 15 microns larger than the die in each direction to ensure that the die will be smaller than the socket, and in consequence, may be 30 microns smaller. This means that the actual positions of the die I/O contacts may be shifted towards one edge or another of the sockets over a distance of 30 microns. Additionally, the individual dice may be rotated slightly with respect to their sockets.

The dice have to be individually picked up and placed into the socket and the pick and place robots have their positioning accuracy limitations as well and it seems that the current state of the art is tolerances of ±50 microns.

If the array of chip packages is processed by developing patterns of routing lines in photoresist using a mask, the routing lines may be accurately aligned with the chip sockets (although even this alignment may be ±10 microns), but won't be optimally aligned with the I/O pillars of the individual dice which could be shifted by as much as 50 microns. This can adversely affect reliability of the contacts between the dice input output pads and the routing lines, and/or yields and thus unit cost.

One way of overcome these limitations, is to limit usage of the technology to relatively simple chips with few outlets allowing routing traces with large ends chip ends for reliably engaging the chip I/O pillars, regardless of the shift or rotation of the chips within their sockets prior to their being fixed by a dielectric filler. It will be appreciated however, that, as illustrated by Moore's Law, the microelectronics industry strives for ever greater complexity, reduction in sizes and increases in cost and reliability.

For the embedded packaging technique of U.S. Ser. No. 14/789,165 and similar embedded technologies to enable reliable, cheap packaging of ever-more complicated IC chips it is necessary to overcome this barrier. Embodiments of the present invention address this issue.

BRIEF SUMMARY

Embodiments of the present invention are directed to providing novel chip packaging solutions.

A first aspect is directed to an embedded die package comprising a die having I/O contact pads in a passivation layer, the die contact pads being coupled to a first side of a feature layer by an adhesion/barrier layer, and a layer of pillars extending from a second side of the feature layer; the die, feature layer and the layer of pillars being encapsulated by a dielectric material, wherein the feature layer comprises routing lines that are individually drawn for good alignment with the I/O contact pads of the die and with pillars.

Optionally, the die is misaligned with sides and edges of the package by more than acceptable tolerances for subsequent reliable deposition of routing lines by stencil exposure of a photoresist.

Optionally, sides of the die are angled to sides of the package be several degrees.

Optionally, one pair of sides of the die is displaced by 3 to 8 microns from a symmetrical position with respect to one pair of parallel sides of the package.

Optionally, each of two pairs of sides of the die are displaced by 3 to 8 microns from a symmetrical position with respect to each of two pairs pair of parallel sides of the package.

Typically, the I/O die contact pads comprise aluminum.

Optionally, the passivation layer comprises either PI or SiN.

Optionally, the adhesion/barrier layer is selected from the group consisting of Ti/Cu, Ti/W/Cu and Ti/Ta/Cu.

Optionally, the adhesion/barrier layer has a thickness in the range of from 0.05 micron to 1 micron.

Typically, the feature layer comprises copper.

Typically, the feature layer has a thickness in the range of from 1 micron to 25 microns.

Optionally, the layer of pillars has a height in the range of 15 microns to 50 microns.

Optionally, the feature layer has a fan-out form.

Alternatively, the feature layer has a fan-in form.

In some embodiments, the chip and said layer of pillars are embedded in different polymer dielectric materials.

In some embodiments, the layer of pillars comprises a grid array of pillars that serve as contacts for coupling the die to a substrate.

In some embodiments, the substrate is a PCB.

In some embodiments, the substrate is a Package for fabricating a Package on Package.

In some embodiments, the grid array of pillars extends up to 10 microns beyond the dielectric or is flush with the dielectric thereby providing LGA pads.

In such embodiments, the pillars of the grid array of pillars is terminated with a terminations selected from the group consisting of Electrolytic Ni/Au, ENIG or ENEIG.

In some embodiments, the grid array of pillars is recessed below the dielectric by up to 10 microns, or is flush with the dielectric, thereby providing BGA pads.

In some embodiments, the grid array of pillars is terminated with an Organic Solderability Preservative OSP.

A second aspect is directed to a method of fabricating the novel chip packages described herein comprising: obtaining a grid of sockets surrounded by a polymer frame; placing the grid of chip sockets on a tape; placing chips face down (flip chip) in the sockets of the grid; laminating a dielectric material over the dies and the grid; applying a carrier over the dielectric; removing the tape and exposing the chip contacts; depositing an adhesive layer comprising at least one of titanium, tantalum, tungsten, chrome and/or nickel followed by a seed layer of copper onto newly exposed surface; applying a first layer of photoresist and developing a pattern with a feature layer; electroplating copper into the pattern to form features; stripping away the first layer of photoresist; applying a second layer of photoresist patterned with a pattern of via pillars; electroplating copper into the pattern to form via pillars; stripping away the second layer of photoresist; etching away exposed portions of the adhesive layer and the copper seed layer; applying a dielectric barrier layer covering the copper features, pillars and undersides of the chips; removing the carrier, thinning the polymer to expose the frame, laminating a thin layer of dark dielectric over the back of the array of dies; thinning the dielectric to expose the copper pillars; applying terminations, and dicing the grid into individual packaged chips.

Typically an array of chips is positioned within each socket.

Optionally, a wafer with an array of chips thereon is positioned within at least one socket.

Optionally, the copper pillars comprise a LGA (Land Grid Array) and are characterized by at least one of the following limitations: a square or rectangular shape; the outer surface being plated with a final metal plating comprising Electroless Nickel/Electroless Palladium/Immersion Gold (EN-EPIG), Electroless Nickel/Immersion Gold (ENIG) or Electrolytic Nickel and Gold (Ni/Au) termination techniques, and optionally protruding by up to 10 microns from the surrounding dielectric.

Alternatively, the copper pillars comprise a BGA (Ball Grid Array) of pads characterized by at least one of: being recessed by up to 10 microns with respect to surrounding dielectric; having cylindrical shape with circular ends for ease of wetting by solder balls; and being coated with OSP (Organic Solderability Preservative).

A further embodiment is directed to a multilayer interposer for coupling a chip to a circuit, wherein a routing layer connects pillars of an adjacent layer aligned with an array of I/O contacts of the chip on one side of the routing layer, and pillars aligned with an array of terminations for coupling to the circuit on the other side of the routing layer.

Typically, the multilayer interposer further comprises a limitation selected from the group comprising: the array of terminations being a ball grid array. the array of terminations being a land grid array, and the routing layer comprising copper routing lines fabricated by electroplating into a patterned photoresist selectively exposed by a laser.

A further embodiment is directed to a chip package for packaging a chip for coupling to a circuit, wherein a routing layer connects pillars of an adjacent layer aligned with an array of I/O contacts of the chip on one side of the routing layer, and pillars aligned with an array of terminations for coupling to the circuit.

Typically, the chip package of claim further comprises a limitation selected from the group comprising: the array of terminations being a ball grid array, the array of terminations being a land grid array and the routing layer comprising copper routing lines fabricated by electroplating into a patterned photoresist selectively exposed by a laser.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings:

FIG. 3A is a simplified schematic plan view from the termination side, showing a die centrally positioned in a socket of a frame, with routing layers and terminations deposited in subsequent layers thereover in registration with the socket, and thus correctly aligned with the die, the dielectric materials of both the frame and the filler used for embedding the die into the socket being transparent;

FIG. 3B is a simplified schematic plan view of a due in a socket from the termination side, showing a die shifted to a the side of the IC socket prior to fixation and thus in a shifted positioned with respect to a socket of a frame, with routing layers and terminations deposited in subsequent layers thereover showing the I/O contacts of the die poorly coupled of the routing lines and termination pillars subsequently deposited, where the routing lines and termination pillars are fabricated by electrodeposition into a pattern developed into a layer of photoresist using a mask to selectively expose the photoresist;

FIG. 3C is a simplified schematic plan view of a due in a socket from the termination side, showing a die that is both shifted and rotated with respect to the IC socket prior to fixation, resulting in poor coupling of the routing lines to the chip terminations; the routing lines and termination pillars are fabricated by electrodeposition into a pattern developed into a layer of photoresist using a mask to selectively expose the photoresist so that the routing lines and termination pillars are nicely arranged with respect to the socket, but misaligned with the die due to the misalignment (shift and rotation) of the die with the socket;

FIG. 4A is a simplified schematic plan view of a die in a socket from the termination side, illustrating how aligning the routing lines of the feature layer with respect to the actually position of the I/O contacts of a die shifted to one side of the socket as in FIG. 3B, such as by using a laser to draw the routing lines, where the termination pillars are printed using a mask in registration with the socket layer, will result with an embedded chip package having terminations nicely aligned with the edges of the package but, unfortunately, poorly aligned with the routing lines, such that, as shown, several routing lines may not be in contact with the terminations at all;

FIG. 4B is a simplified schematic plan view of a die in a socket from the termination side, illustrating how aligning the routing lines of the feature layer with respect to the actually position of the I/O contacts of a die shifted to one side of the socket as in FIG. 3A or FIG. 3B, such as by using a laser to draw the routing lines, and then positioning the termination pillars with respect to the routing layers by laser patterning, creates good contacts between the routing layers and termination pillars, but shifts the terminations with respect to the sides of the package and may make subsequent coupling the package to a substrate difficult or impossible;

FIG. 4C is a simplified schematic plan view of a die in a socket from the termination side, illustrating how aligning the routing lines of the feature layer with respect to the actually position of the I/O contacts of a die shifted and partially rotated within the socket as in FIG. 3C, such as by using a laser to pattern a photoresist by selective exposure of routing lines to create a pattern for subsequently electroplating, where the termination pillars are fabricated in the conventional manner by selective exposure of photoresist using a mask to create a pattern for subsequently electroplating, in registration with the socket layer, will result with an embedded chip package having terminations nicely aligned with the edges of the package but unfortunately, poorly aligned with the routing lines of the feature layer, such that, as shown, several terminations are not in contact with the routing lines;

FIG. 4D is a simplified schematic plan view of a die in a socket from the termination side, illustrating how aligning the routing lines of the feature layer with respect to the actually position of the I/O contacts of a die shifted and partially rotated within the socket as in FIG. 3C, such as by using a laser to draw the routing lines, where the termination pillars are likewise fabricated by selectively exposing photoresist, using the routing layer for alignment purposes, will result with an embedded chip package having terminations nicely connected to the routing lines, but unfortunately poorly aligned with the edges of the package making difficult subsequent coupling to a support structure such as a printed circuit board;

Like reference numbers and designations in the various drawings indicated like elements.

The term micron means $1 \times 10^{-6}$ of a meter, and may be annotated "µm".

The term chip and die are used interchangeably herein, as they are in industry to relate to the unpackaged IC circuit, and the term embedded chip package refers to the packaged and terminated chip.

DETAILED DESCRIPTION

In the description hereinbelow, support structures consisting of metal vias in a dielectric matrix, particularly, copper via posts in a polymer matrix, such as polyimide, epoxy or BT (Bismaleimide/Triazine), Polyphenylene Ether (PPE), Polyphenylene Oxide (PPO) or their blends, reinforced with glass fibers are considered.

Figure 1:
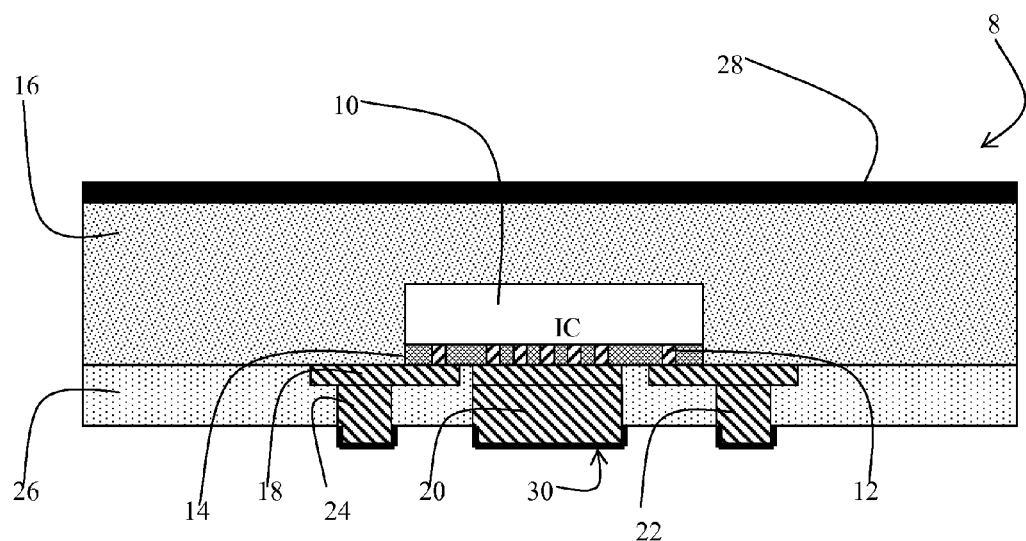
FIG. 1 is a simplified schematic section through an electronic chip package in accordance with one embodiment that enables coupling a packaged chip to a substrate by a Land Grid Array (LGA)

With reference to FIG. 1, a simplified section through an electronic chip package 8 in accordance with one embodiment that enables coupling a chip 10 to a substrate by a Land Grid Array (LGA) 20, 22, 24 is shown.

The electronic chip package 8 consists of a die or chip 10 with aluminum pillars 12 in a passivation layer 14 comprises either PI or SiN.

The chip 10 with aluminum pillars 12 in a passivation layer 14 is encapsulated by laminating with a first dielectric material 16 having a polymer matrix such as polyimide, epoxy or BT (Bismaleimide/Triazine), Polyphenylene Ether (PPE), Polyphenylene Oxide (PPO) or their blends, either provided as a film, or as a pre-preg reinforced with glass fibers for additional stiffness.

Pads 18 are coupled to the aluminum pillars 12.

A layer of copper pillars 20, 22, 24 is fabricated on the opposite side of the pads 18 from that on which the IC 10 is positioned.

Usefully the pads 18 fan out and one or more of these pillars 22, 24 are positioned beyond the perimeter of the IC chip 10, in what is commonly referred to as a fan-out configuration for ease of coupling to a substrate such as a PCB having contacts on a coarser scale One of more of these pillars 20 may be a large pillar beneath the chip that in addition to providing electrical connection to selected pillars 12 and possibly connecting several such pillars 12 together and maybe to ground, also serves as a heat sink, drawing heat away from the chip 10 and allowing it to dissipate over a large volume, it being noted that the dielectric materials 16, 26 are generally good heat insulators, i.e. poor heat conductors, and flip chip configurations may suffer from over-heating causing data corruption or noise.

Instead of a fan-out configuration, it will be appreciated that the technology may provide a fan-in configuration if desired. Furthermore, where the processing is of several chips 'on wafer', before segmenting, rather than of individual chips, fan out configurations are generally not possible.

The pads 18 and pillars 20, 22, 24 may be encapsulated in a dielectric material 26 which may be a different dielectric material from the dielectric 16 that encapsulates the chip 10. A thin layer of a dark dielectric 28 (typically black) may be laminated over the top of the die package 8 to aid laser marking visibility. The layer of dark dielectric 28 may be provided as a prepreg or as a polymer film.

For coupling to substrates such as printed circuit boards (PCBs) with a Land Grid Array (LGA), the columns 20, 22, 24 are often square or rectangular, but may, nevertheless, have other shapes, and may be round for example.

For ease of attachment to the substrate, the ends of the columns 20, 22, 24 may protrude by up to 10 microns beyond the dielectric. The exposed ends of the columns 20, 22, 24 will typically be coated with a final metal plating 30 on their external surface comprising Electrolytic Ni/Au sometimes known as Electroless Nickel Immersion Gold, or of Ni/Pd/Au, where there is a layer of palladium on the nickel and under the gold, in a process known as ENEPIG.

Figure 2:
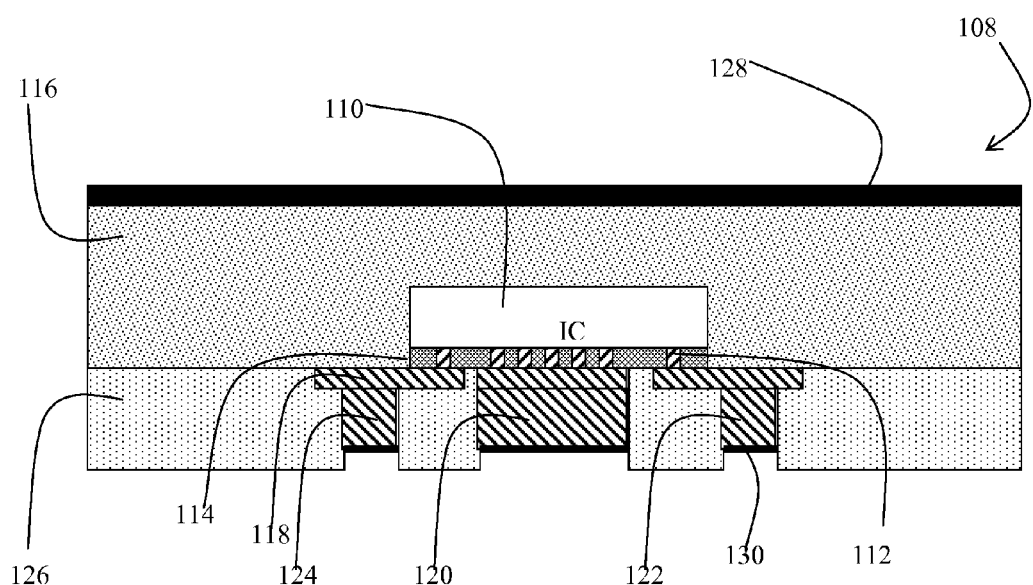
FIG. 2 is a simplified schematic section through an electronic chip package in accordance with one embodiment that enables coupling a packaged chip to a substrate by a Ball Grid Array (BGA)

Referring to FIG. 2, a second a simplified section through an electronic chip package 108 in accordance with one embodiment that enables coupling a chip 110 to a substrate by a Ball Grid Array (BGA) 120, 122, 124 is shown.

The electronic chip package 108 consists of a die or chip 110 with aluminum pillars 112 in a passivation layer 114 comprises either PI or SiN.

The chip 110 with aluminum pillars 112 in a passivation layer 114 is encapsulated by laminating with a first dielectric material 116 having a polymer matrix such as polyimide, epoxy or BT (Bismaleimide/Triazine), Polyphenylene Ether (PPE), Polyphenylene Oxide (PPO) or their blends, either provided as a film, or as a pre-preg reinforced with glass fibers for additional stiffness.

Pads 118 are coupled to the aluminum pillars 112.

A layer of copper pillars 120, 122, 124 is fabricated on the opposite side of the pads 118 from that on which the IC 110 is positioned.

Usefully the pads 118 fan out and one or more of these pillars 122, 124 are positioned beyond the perimeter of the IC chip 110, in what is commonly referred to as a fan-out configuration for ease of coupling to a substrate such as a PCB having contacts on a coarser scale. One of more of these pillars 120 may be a large pillar beneath the chip that in addition to providing electrical connection to selected pillars 112 and possibly connecting several such pillars 112 together and maybe to ground, also serves as a heat sink, drawing heat away from the chip 110 and allowing it to dissipate over a large volume, it being noted that the dielectric materials 116, 126 are generally good heat insulators, i.e. poor heat conductors, and the flip chip configurations may suffer from over-heating causing data corruption or noise.

Instead of a fan-out configuration, it will be appreciated that the technology may provide a fan-in configuration if desired. Where several chips are packaged and terminated on a wafer prior to segmentation, the fan-out configuration is generally not possible.

The pads 118 and pillars 120, 122, 124 may be encapsulated in a dielectric material 126 which may be a different dielectric material from the dielectric 116 that encapsulates the chip 110. A thin layer of dark dielectric 128 may be laminated over the top of the die package 108 to aid laser marking visibility. The layer of dark dielectric 128 may be provided as a prepreg or as a polymer film.

For coupling to substrates such as printed circuit boards (PCBs) with a Ball Grid Array (BGA), where a ball of solder is attached to the end of the columns and spreads out therefrom into a semispherical cap, the columns 120, 122, 124 are typically cylindrical with round cross-sections for easy wetting by the solder balls, but the columns 120, 122, 124 may, nevertheless, have other shapes, and may be elliptical, square or rectangular for example.

Unlike the protruding ends of the columns 20, 22, 25 of FIG. 1, for BGAs, typically the ends of the columns 120, 122, 124 are countersunk into the dielectric 126 which extends up to 10 microns beyond the ends of the columns 120, 122, 124 and helps with containing the solder ball to be subsequently applied upon package completion. To prevent tarnishing prior to application of the Ball Grid Array (BGA) of solder balls, the ends of the columns 120, 122, 124 will typically be coated with a final layer of Organic Solderability Preservative (OSP) 130.

Additionally, it should be noted that both copper posts serving as LGA and BGA pads in the packages described in FIG. 1 and FIG. 2 respectively, contain post structures that are typically at least 200 microns in width (or diameter) and typically 15 micron to 50 micron in thickness. The dimensions of the copper posts can further assist in reducing the DC resistance to currents entering or exiting the chip—thereby increasing the functional range of the chip and the overall package reliability—especially for high power die applications.

With reference to FIG. 3A-C, the position of the die with respect to the socket may vary somewhat. This is due to variations in die dimensions and in socket dimensions as a result of manufacturing limitations. The pick and place robots have even larger limitations. Consequently the position of the die pads may vary by as much as ±25 microns from the optimal position.

Referring to FIG. 3A, there is shown, in a simplified schematic plan view, an embedded die package 250A from the termination side. The dielectric frame 206 may be a fiber reinforced composite with a polymer matrix, and the dielectric filler 208 that couples the die 200 to the wall of the socket 204 may be a transparent polymer, as may be the dielectric that laminates the routing lines 220 and the termination pillars 230. It will, however, be appreciated that in general, the dielectrics may be polymer or fiber reinforced polymer. The die 200 is centrally positioned in the socket 204 of a frame 206, and since the routing lines 220 in the feature layer and terminations 230 deposited in subsequent layers thereover are themselves in registration with the array of sockets 204, they are also correctly aligned with the die 200. Indeed, they are correctly aligned with the I/O connections 210 of the die 200.

Since the socket 204 is larger than the die 200, both due to the accuracy of pick and place robots, and due to the precision of the socket 204 fabrication and the die 200 segmentation, it will be appreciated that the position of the die 200 centrally and nicely aligned to the socket edges of the die package 250A shown in FIG. 3A is not reliably achievable.

With reference to FIG. 3B, there is shown, in simplified schematic plan view from the termination side, a die package 250B wherein the die 200' is shifted to a side 205 of the IC socket 204 prior to fixation with the dielectric filler 208' and thus in a shifted positioned with respect to the socket 204 of the frame 206.

Where the routing lines 220 of the feature layer and the terminations 230 of die package 250B are deposited in subsequent layers thereover into patterned photoresist processed in the conventional manner via a mask that is aligned with the array of sockets 204 and frames 260 in a panel processing, the I/O contacts 210' of the die 200' are poorly coupled to the routing lines 220, resulting in reduced yields and increased unit cost. In less serious shifts, where none of the routing lines 220' are fully detached from the I/O contacts 210' but are poorly connected thereto, there are likely to be reliability issues.

With reference to FIG. 3C, there is shown, in simplified schematic plan view, a die package 250C wherein the die 200" is both shifted and rotated with respect to the IC socket 204 prior to fixation thereinto, resulting in poor coupling of the routing lines 220" of the feature layer to the I/O contacts 210" of the die 250C. Here again, the routing lines 220" and termination pillars 230 are typically fabricated by electrodeposition into a pattern developed into a layer of photoresist by illumination through a photo-mask to selectively expose the photoresist. That as may be, the pattern for both the routing lines 220" and the termination pillars 230 are aligned with the array of sockets 204 and frames 206, so the terminations 230 are nicely positioned with respect to the edges of the embedded chip package 250C, and the routing lines 220" are nicely and reliably coupled to the terminations 230. However some of the routing lines 220" may be detached from the I/O contacts 210" of the die 200" and thus unacceptable. This failure reduces yields, and thereby increases unit manufacturing cost. With less significant shifts and rotations, the routing lines 220" may be poorly attached to the I/O contacts 210" an may pass initial inspection and quality control, but will have poor reliability and may subsequently fail in service. These problems may be overcome by using larger dies with fewer contacts, but this is undesirable and limits usage to simpler and less demanding applications.

With reference now to FIG. 4A, a schematic plan view of an embedded chip package 350A from the termination side is shown, where the die 200' is shifted to one side of the socket 204 as in FIG. 3B. However, instead of positioning the routing lines 220' of the feature layer with respect to the sockets 204 and frames 206 by registering a photomask with the array of sockets 204 and frames 206, the routing lines 220' of the feature layer may be aligned with respect to the actual position of the I/O contacts 210' of the die 200'. This may be achieved by using a laser to selectively expose the photoresist to 'write' a pattern for subsequent electroplating of the routing lines 220' of the feature layer.

The position of the termination pillars 230 may be again determined by selective exposure of a photoresist using a photomask in registration with the sockets 204 and frame 206, thereby ensuring that the termination pillars 230 of the embedded chip package 350A are nicely nicely aligned with the edges of the package 350A, but, unfortunately, the termination pillars 230 will be poorly aligned with the routing lines 220', such that, as shown, one of more termination pillars 230 may not be in contact with the routing lines 220'. This results in operation failure, and this problem lowers yields and thereby increases unit manufacturing costs. Again, a poor contact may result in poor reliability with a component passing testing, but subsequently failing in use.

With reference to FIG. 4B, a schematic plan view of an embedded chip package 350B from the termination side is shown, wherein the routing lines 220' of the feature layer are aligned with respect to the actual position of the I/O contacts 210' of a die 200' shifted to one side of the socket 204 as in FIG. 3B, such as by using a laser to draw the routing lines 220'. The termination pillars 230 are aligned with respect to the routing layers, also by laser patterning. Using the routing lines 220' or the chip 200' for alignment creates good contacts between the routing layers 220' and termination pillars 230', but shifts the terminations 230' with respect to the sides of the package 350B and may make subsequent coupling the package 350B to a substrate difficult or impossible, again reducing yields and increasing unit costs, or, where the chip is, nevertheless, mountable, may adversely affect reliability.

With reference to FIG. 4C, a schematic plan view of an embedded chip package 350C from the termination side is shown, wherein that the routing lines 220" of the feature layer may be aligned with respect to the actual position of the I/O contacts 210" of a die 200" shifted and partially rotated within the socket 204 as in FIG. 3C. This may be achieved by using a laser to selectively expose a layer of photoresist by writing the pattern to create routing lines 220" by subsequent electroplating thereinto. Here, if the termination pillars 230 are fabricated in the conventional manner by selective exposure of a photoresist layer using a mask aligned with the frame 206 and socket 204 arrays to create a pattern that is in registration with the sockets 204 for subsequently electroplating, the resulting embedded chip package 350C will have terminations 230 nicely aligned with the edges of the package 350C but unfortunately, poorly aligned with the routing lines 220" of the feature layer, such that, as shown, several terminations 230 may not contact the routing lines 220" at all, resulting in failure. Thus the I/O contacts 210" of the package 350C are reliably coupled to the routing lines 320 in the feature layer, but may be poorly coupled to the termination pillars 330 if at all, again reducing yields and increasing unit costs and/or poor reliability.

With reference to FIG. 4D a schematic plan view of an embedded chip package 350D from the termination side is shown, such that the routing lines 220" of the feature layer may be aligned with respect to the actually position of the I/O contacts 210" of a die 200" shifted and partially rotated within the socket 204 as in FIG. 3C, such as by using a laser to draw the routing lines, where the termination pillars 230" are likewise fabricated by selectively exposing photoresist via a laser writing technique and using the routing layer 320 for alignment purposes, will result with an embedded chip package 350D having terminations 230" nicely aligned with the die 200", but unfortunately, in poorly alignment with the edges of the package 350D, making difficult the subsequent mounting of the package to a substrate such as a PCB, for example.

It will be appreciated that there is an overall drive towards greater complexity and size reduction and integrated circuits have consistently migrated to smaller feature sizes over the years, allowing more circuitry to be packed on each chip. This increased capacity per unit area can be used to decrease cost or increase functionality. The empirical law of thumb known as Moore's Law states that the number of transistors in an integrated circuit doubles every two years. In general, as the feature size shrinks, almost everything improves—the cost per unit and the switching power consumption go down, and the speed goes up. High yields and reliability are both critical.

Until now, the only way to overcome the alignment and reliability problems of embedded chip packages discussed above, has been by having very few relatively large I/O contacts on the chip connected to relatively few and relatively large terminals on the package, making such embedded chip packages unsuitable for applications with smaller chips and high contact densities.

In particular, there is a need to control the position of the routing lines and pillars to within ±12.5 microns, however, pick and place robots when optimized, have limitations of ±25 microns.

Figure 5A:
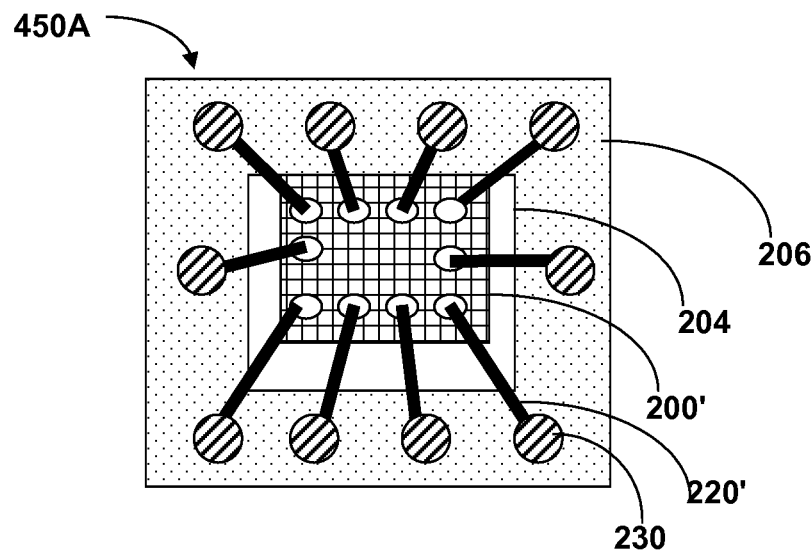
FIG. 5A is a simplified schematic plan view of a die in a socket from the termination side, illustrating how the routing lines of the feature layer may be laser drawn on photoresist to selectively expose the photoresist to create trenches therein for pattern electroplating copper thereinto to connect the actually positions of the I/O contacts of a die shifted to one side of the socket (as in FIG. 3B) with the correct position for termination pillars with respect to the socket and frame, thereby creating good contacts between the routing layers and termination pillars, regardless of whether the termination pillars are fabricated by selective exposure of photoresist using a mask or a laser writer.

With reference to FIG. 5A a schematic plan view of an embedded chip package 450A from the termination side is shown, having a shifted die 200' with respect to the socket 204. The routing lines 220" of the feature layer may be laser drawn on photoresist to selectively expose the photoresist to create trenches therein for pattern electroplating copper thereinto to connect the actual positions of the I/O contacts 110' of a die 200' shifted to one side of the socket (as in FIG. 3B) with the correct position for termination pillars 230 with respect to the socket 204 and frame 206, thereby creating good contacts between the routing layers and termination pillars 230, regardless of whether the termination pillars 230 are fabricated by selective exposure of photoresist by using a mask or by using a laser writer.

Figure 5B:
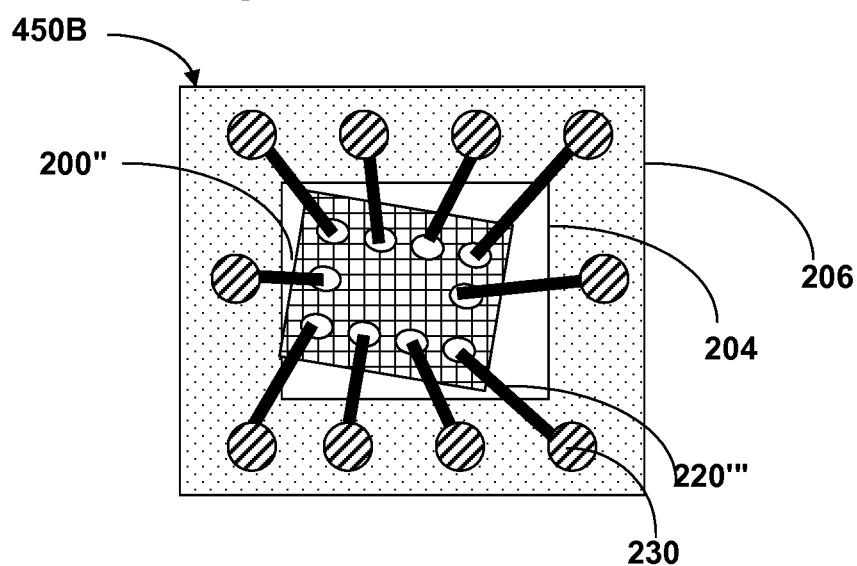
FIG. 5B is a simplified schematic plan view of a die in a socket from the termination side, illustrating how aligning the routing lines of the feature layer with respect to the actually position of the I/O contacts of a die shifted and partially rotated within the socket as in FIG. 3C, and with the correct position for termination pillars that are subsequently fabricated thereonto by selectively exposing photoresist, either with a mask or a laser writer, provides good contacts of the routing lines with both I/O contacts of the die and with the termination pillars, such that the termination pillars are correctly aligned with the edges of the die package.

With reference to FIG. 5B a schematic plan view of an embedded chip package 450B from the termination side is shown, wherein the die 200" is shifted and partially rotated within the socket 204 as in FIG. 3C. FIG. 5B illustrates how the routing lines 220''' of the feature layer may be aligned at one end with respect to the actual position of the I/O contacts 210", and at the other end with the correct position for termination pillars 230 that are subsequently fabricated thereonto by selectively exposing photoresist, either with a mask or a laser writer, providing good contacts of the routing lines with both I/O contacts of the die 200" and with the termination pillars 230, such that the termination pillars 230 are correctly aligned with the edges of the die package 450D.

Thus it is shown that by laser drawing the feature lines 220', 220" to connect actual the positions of the terminals of a die 200', 200" with desired locations for termination pillars 230 of a die package, yields and reliability may be increased and chips with high density of terminals may be reliably packaged.

As shown in FIGS. 3A-D, 4A-B, 5A-B, the termination pillars may be cylindrical with round ends, as preferably for subsequent attachment to a substrate using a Ball Grid Array (BGA). Alternatively, however, it will be appreciated that the termination pillars may have a square or rectangular profile and square/rectangular ends, as preferable for subsequent attachment to a substrate using a Land Grid Array (LGA), for example.

Figure 6:
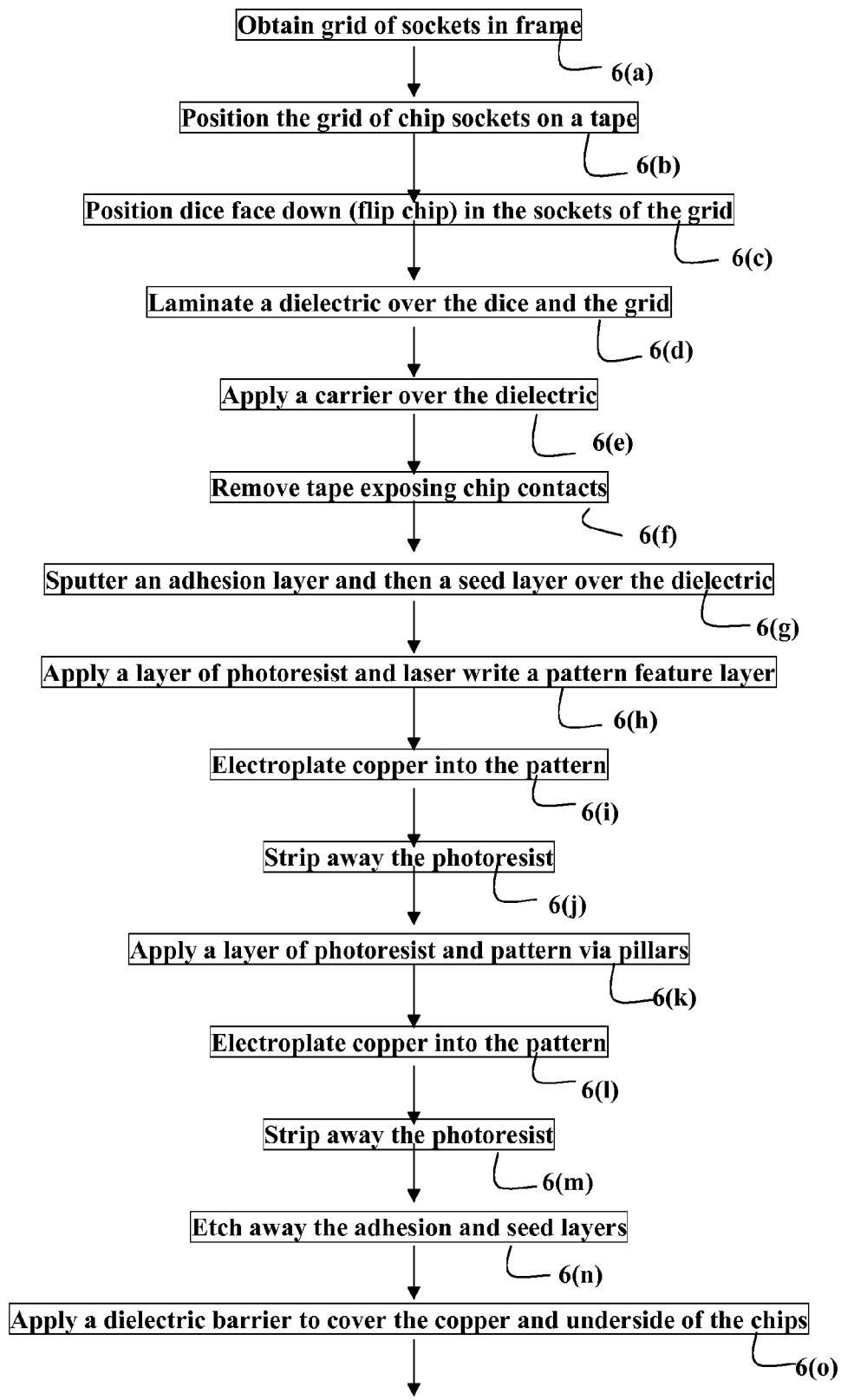
FIG. 6 is a flowchart showing how the electronic chip packages of FIG. 5A-D to may be fabricated, and FIGS. 6(a) to 6 (u) are accompanying side view sketches of intermediate structures corresponding with the steps of the flowchart of FIG. 6.
Figure 6:
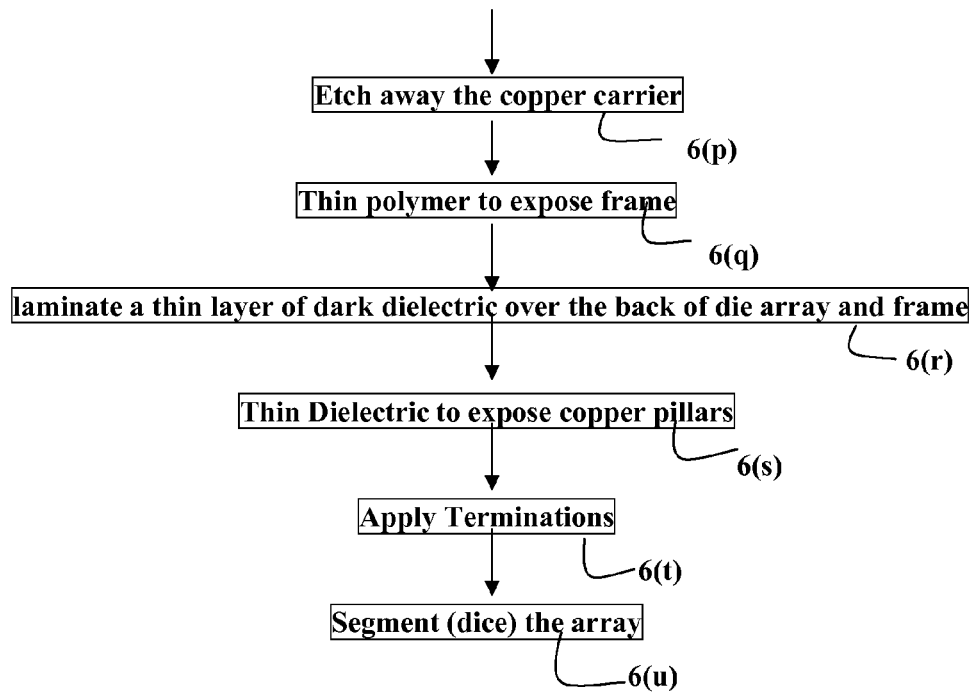
Figure 6A:
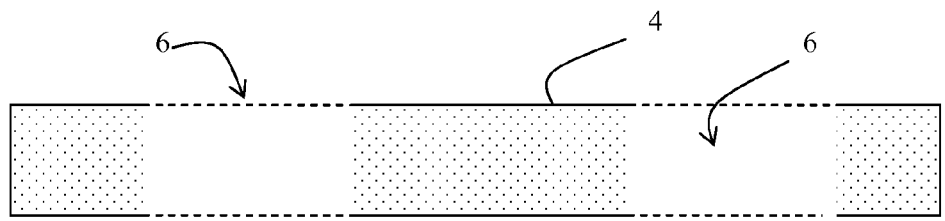
Figure 6B:
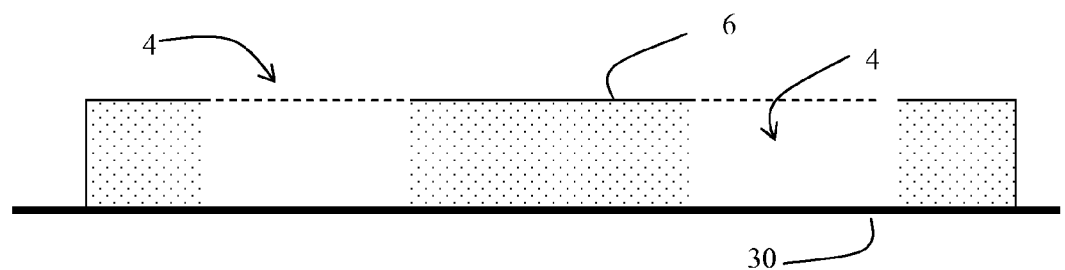
Figure 6C:
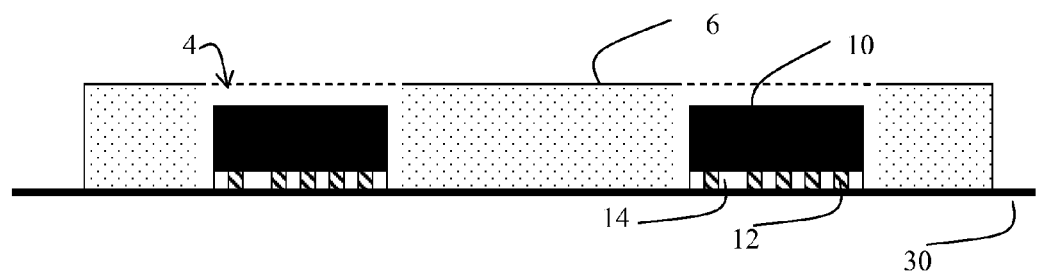
Figure 6D:
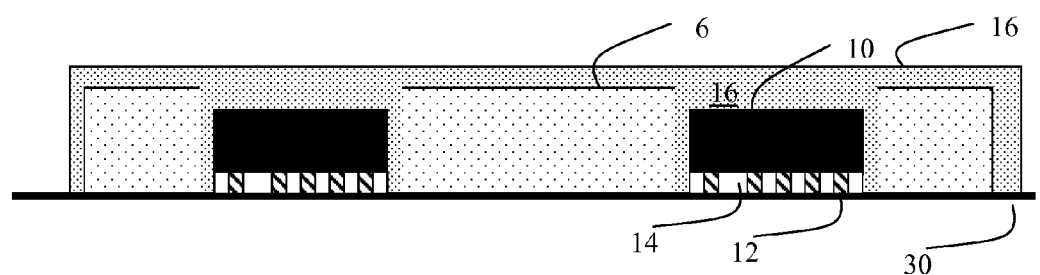
Figure 6E:
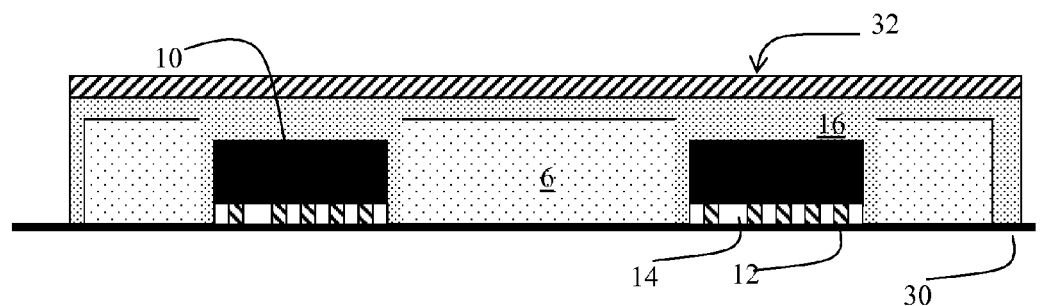
Figure 6F:
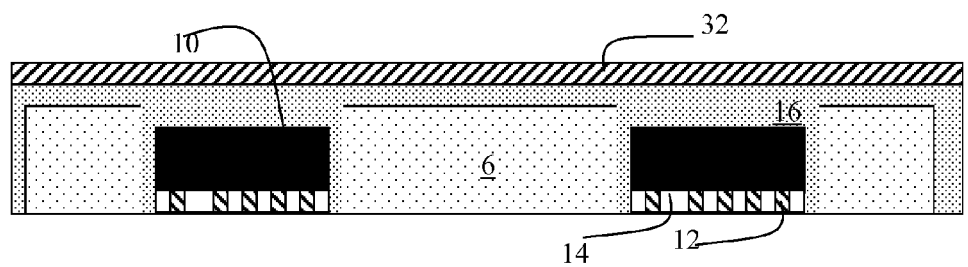
Figure 6G:
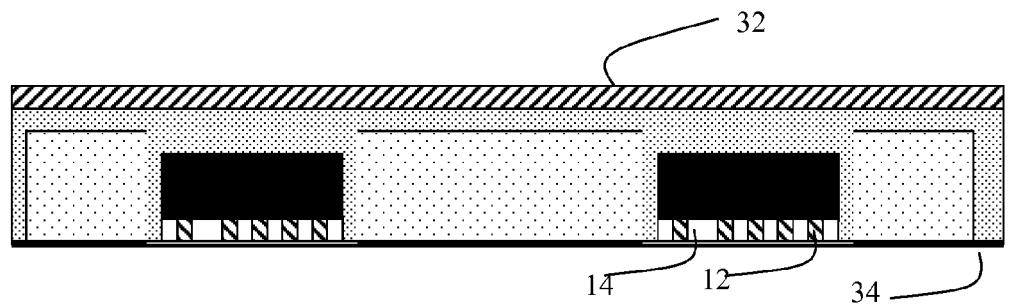
Figure 6H:
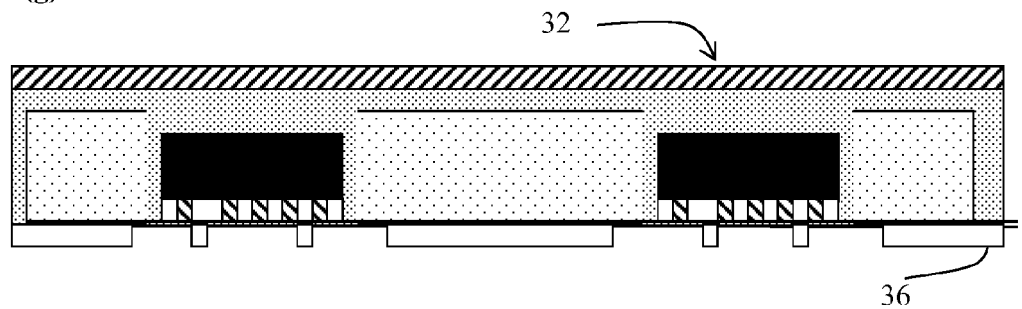
Figure 6I:
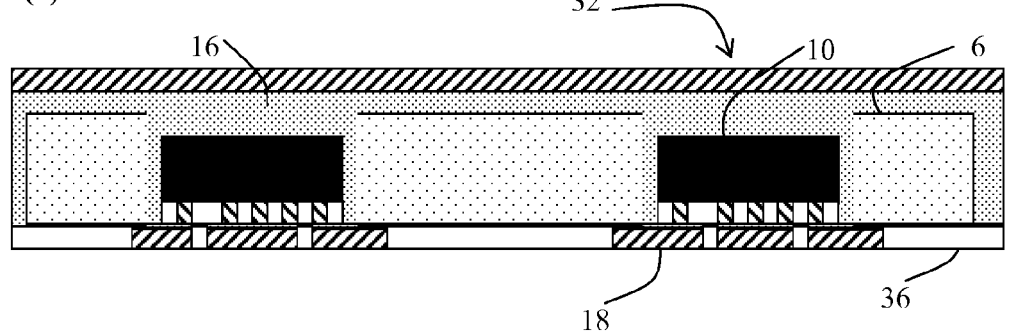
Figure 6J:
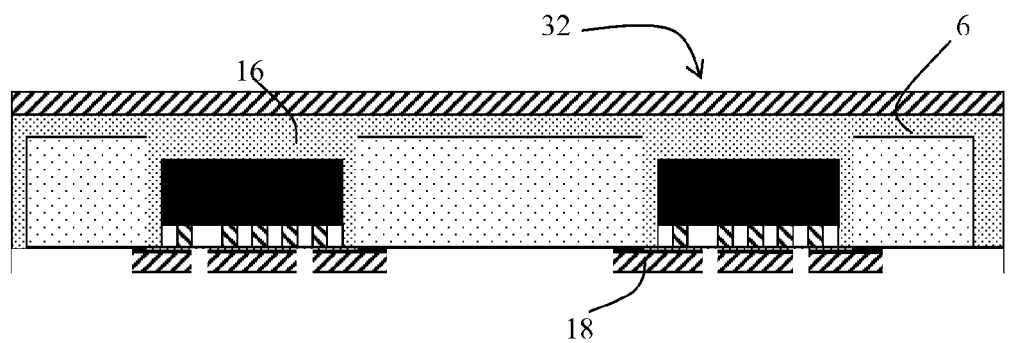
Figure 6K:
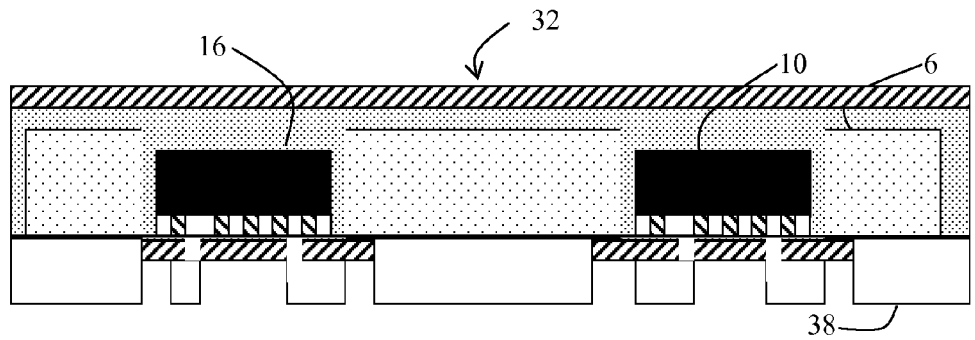
Figure 6L:
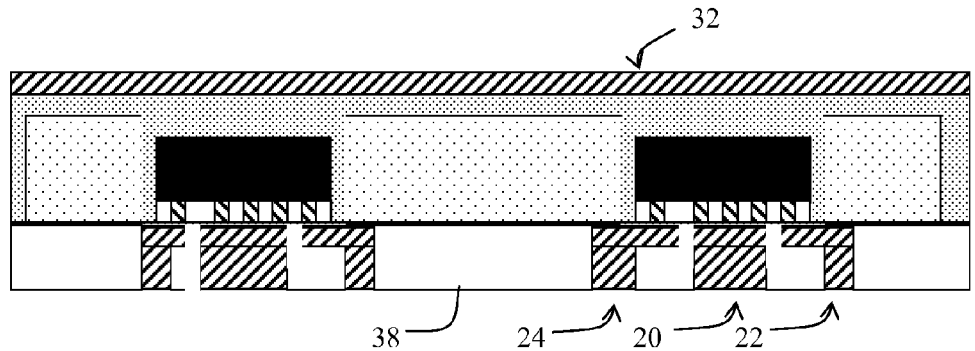
Figure 6M:
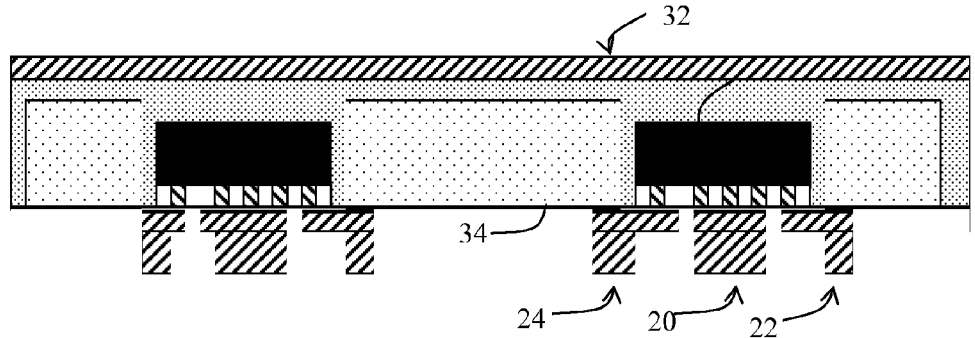
Figure 6N:
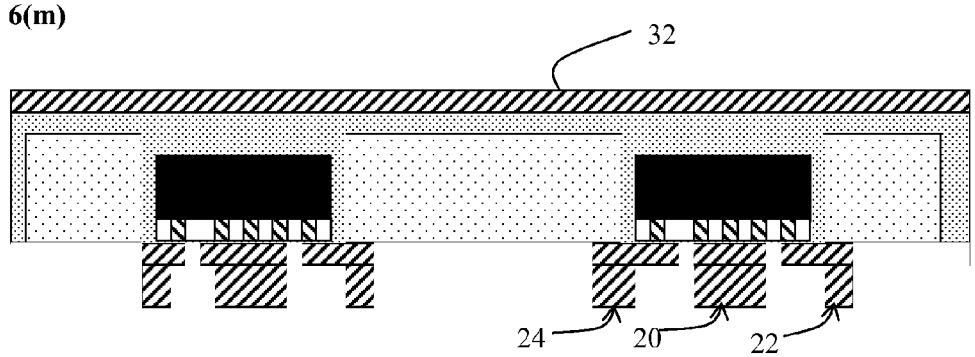
Figure 6O:
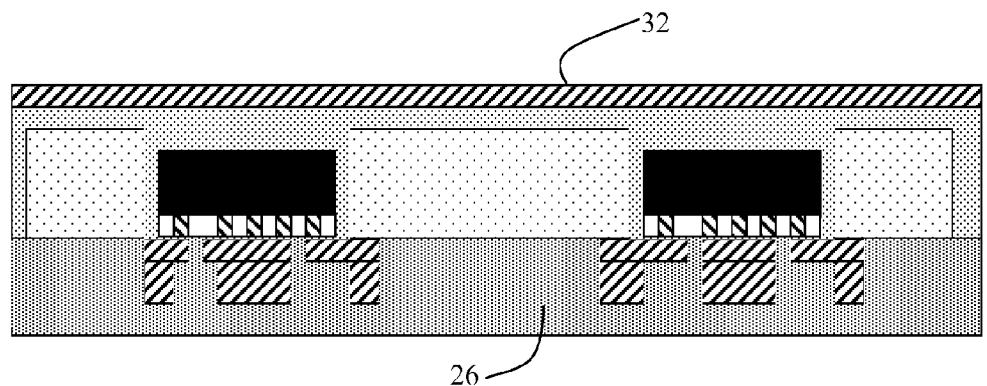
Figure 6P:
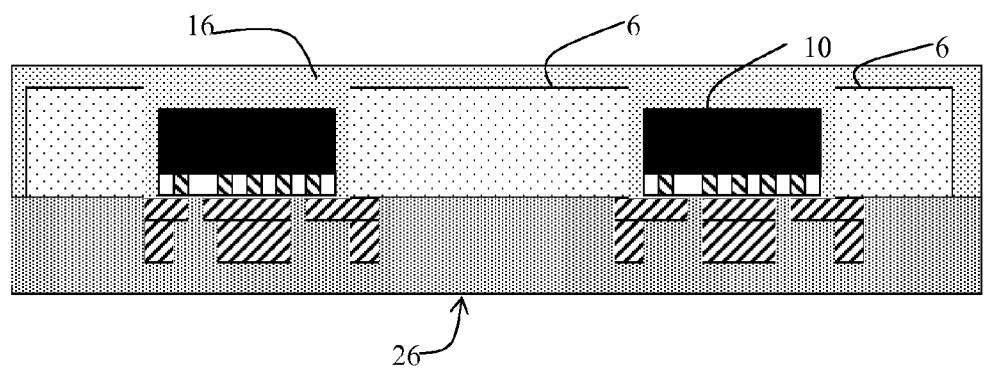
Figure 6Q:
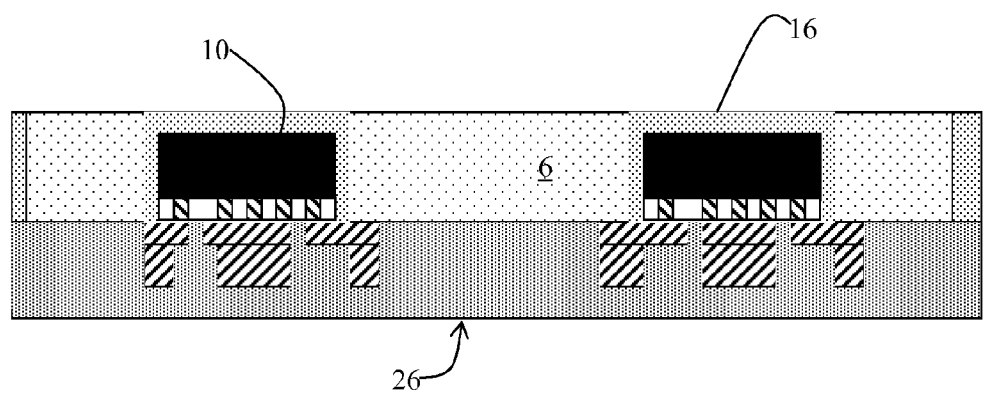
Figure 6R:
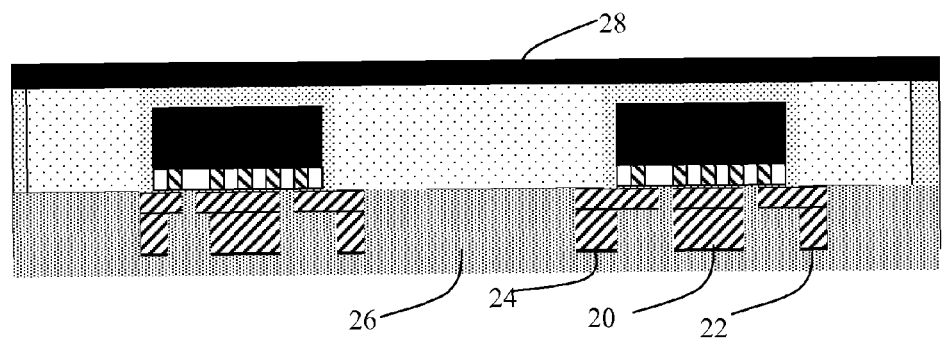
Figure 6S:
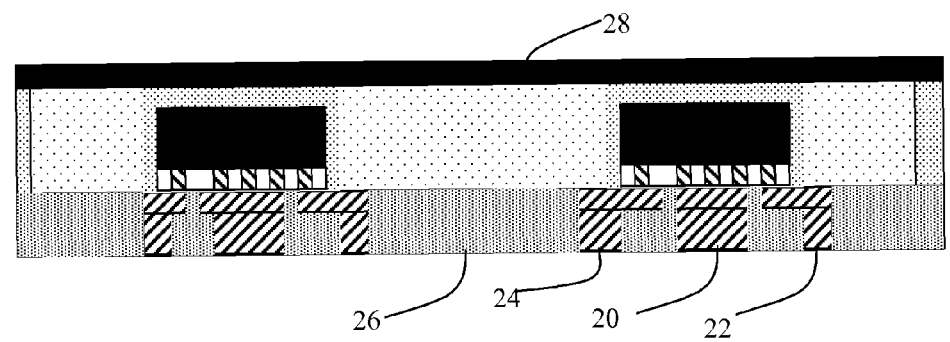
Figure 6T:
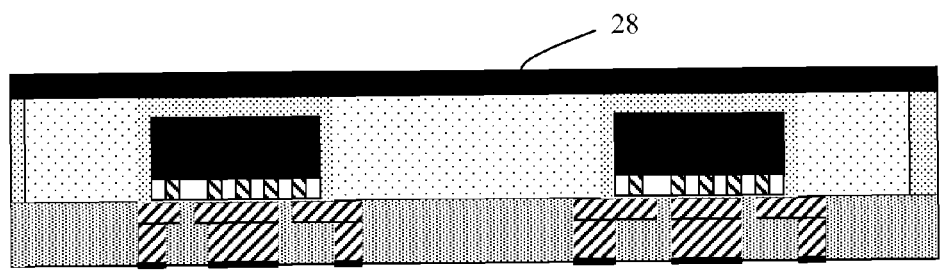
Figure 6U:
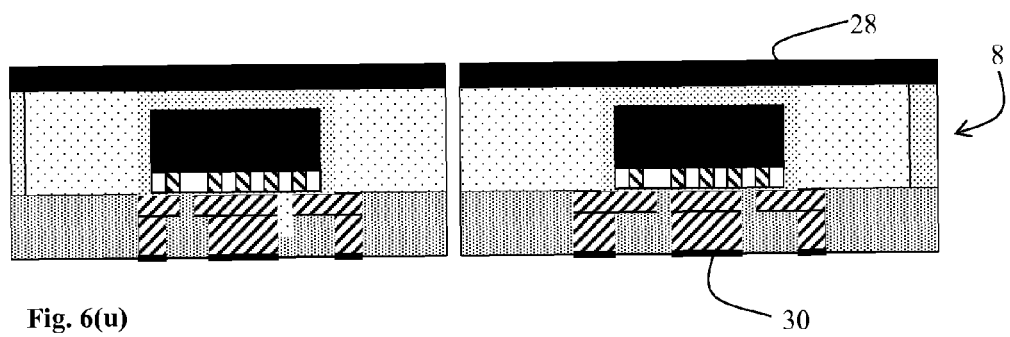

With reference to FIGS. 6 and 6(a)-6(u) a processing route for processing the structures of FIGS. 5A and 5B are shown.

With reference to the flowchart of FIG. 6 and to FIGS. 6(a) to 6(u) showing schematic side views of a section of an array of sockets 6 in a polymer frame 4 and the embedding and connecting of a chip 10 therein, a method of fabricating the structures of FIGS. 1 and 2 is now explained in some detail.

First a grid of sockets 6 surrounded by a polymer frame 4 is procured—step 6(a). FIG. 6(a) shows a couple of adjacent sockets. The following description shows and describes processing a couple of individual chips picked and placed in single chip sockets. In practice, a large two dimensional array of sockets may be processed together. Furthermore, in a variant process, a single socket could be used for processing a wafer with a grid of chips thereupon, that may subsequently be segmented.

The frame 6 may consist of a polymer applied as a polymer sheet, or may be a glass fiber reinforced polymer, applied as a prepreg. It may have one or more layers. The through-thickness sockets 4 may be punched out, or the frame 6 may be fabricated over sacrificial copper stubs that are subsequently dissolved to provide through-thickness sockets 4.

Zhuhai Access' panels may be 21"×25", and a packaged chip may be 5 mm×5 mm. Consequently this manufacturing technique enables 10,000 chips to be packaged on each panel.

It will be appreciated, however, that not all the blocks of the panel need to have chip sockets of the same size. Furthermore, not only may one or more blocks be used for a different sized socket for receiving a different sized chip, but any sub array of any size may be used to fabricate any specific die package, so despite the large throughputs, small runs of small numbers of die packages may be fabricated, enabling different die packages to be simultaneously processed for a specific customer, or different packages to be fabricated for different customers. Thus a panel may comprise at least one region having sockets with a first set of dimensions for receiving one type of chip, and a second region having sockets with a second set of dimensions for receiving a second type of chip. Furthermore, arrays of chips on one or more wafers may be positioned in wafer sized sockets in such panels and the chips may be subsequently packaged prior to the wafer being segmented.

A grid of chip sockets is obtained—step 6(*a*), such that each chip socket 4 is surrounded by a polymer frame 6. See FIG. 6(*a*). The grid of chip sockets 4 is placed on a tape 30—step 6(*b*) FIG. 6(*b*). Dice (chips) 10 are placed face down (flip chip) in the sockets 4 of the frame 6 step 6(*c*) FIG. 6(*c*) such that the (typically aluminum) I/O contacts 12 in the passivation layer 14 (see FIGS. 1 and 2) are in contact with the tape 30.

A dielectric material 16, typically a polymer film or a fiber in polymer pre-preg is laminated over the dice 10 and the grid 6—step 6(*d*) FIG. 6(*d*).

A carrier 32 is now applied over the dielectric 16, step—6(*e*) FIG. 6(*e*). The tape 30 is now removed—step 6(*f*), FIG. 6(*f*), exposing the chip contacts 12. An adhesion layer 34 comprising at least one of titanium, tantalum, tungsten, chrome and/or nickel is deposited on the newly exposed surface, followed by a seed layer of copper—step 6(*g*) FIG. 6(*g*). Physical vapor deposition (PVD) is typically used. The choice of adhesion metal 34 depends on the polymer 6 and passivation layer 14. Typical combinations for the adhesion layers 34 are Ti/Cu, Ti/W/Cu, Ti/Ta/Cu and Cr/Cu having a thickness range of 0.05 microns to 1 micron.

A layer of photoresist 36 is applied and patterned to form a feature layer. However, instead of patterning the entire array with a stencil using the chip sockets for alignment purposes, the actual position and alignment of each chip with respect to the its socket is determined using image processing through the photoresist or by imaging prior to deposition of the photoresist and by using identifiable reference points after deposition of the photoresist. The patterning of the feature layer is then accomplished by a laser, writing each routing line to connect the actual position of the I/O contact of the chip with the desired position of the package terminals with respect to the frame—step 6(*h*), FIG. 6(*h*). Copper is then electroplated into the laser written pattern to form features, i.e. routing lines 18—step 6(*i*), FIG. 6(*i*). Typically the features 18 are in the range of from 1 micron to 25 microns thick. The features 18 may fan out from the die, or may fan inwards. Some features may fan outwards and some may fan inwards. When processing a chip array on a wafer, fan out configurations are generally not possible.

The photoresist 36 is stripped away—step 6(*j*), FIG. 6(*j*), and a second layer of photoresist 38 is applied and patterned with via pillars—step 6(*k*), FIG. 6(*k*). Here the patterning may be again achieved using a laser to write the pattern, but a photomask mask be used as the pillar position is determined with respect to the grid of frames 6. Processing using a photomask is generally more economical for an array of individual pillars 20 at fixed positions with respect to the grid of frames 6, than laser writing.

Copper is then electroplated into the pattern to form a layer of via pillars 20, 22, 24—step 6(*l*), FIG. 6(*l*). Typically the via pillars 20 are in the range of from 15 microns to 50 microns long.

The second layer of photoresist 38 is stripped away—step 6(*m*), FIG. 6(*m*), and the sputtered adhesion layer 34 of one or more of Ti, Ta, Ni, Cr, W, together with the copper seed layer is then etched away 6(*n*).

A dielectric barrier layer 26 is then applied to cover the copper features (routing lines) 18 and pillars 20, 22, 24 and the underside of the chips 10—step 6(*o*), FIG. 6(*o*).

Next, the carrier 32 is removed. Typically, the carrier is copper and is simply etched away. It may be two layer copper carrier, comprising a thin layer peelably attached to a thicker layer in which case the thicker layer is peeled off and the thinner layer is etched away—step 6(*p*), FIG. 6(*p*).

The polymer may be thinned by polishing, grinding or by chemical mechanical polishing CMP—step 6(*q*) to expose the frame.

At this stage, a thin layer of a dark, e. g. black dielectric 28 (film or pre-preg) may be laminated over the back of array of dies 10 and the frame 6—step 6(*r*), FIG. 6(*r*).

The photoresist or other polymer dielectric 26 is thinned to expose the copper pillars 20, 22, 24—step 6(*s*), FIG. 6(*s*).

Terminations 30 are applied 24—step 6(*t*), FIG. 6(*t*) and the array is segmented (diced) into individual packaged chips 8—step 6(*u*), FIG. 6(*u*).

As shown in FIG. 6(*u*) and FIG. 1, the copper pillars 20, 22, 24 comprise a Grid Array of pads that serve as contact in the form of LGA (Land Grid Array) and the top surface of the copper pillars 20, 22, 24 which may be flush with the dielectric 26 therearound (Fig. u) or may protrude for up to about 10 microns beyond the surface of the dielectric (FIG. 1) are plated with a final metal plating on their external surface comprising Electroless Nickel/Electroless Palladium/Immersion Gold (ENEPIG) or Electroless Nickel/Immersion Gold (ENIG) or Electrolytic Nickel and Gold (Ni/Au) termination techniques. In land grid array structures, the pillars 20, 22, 24 may be square or rectangular.

Thus a method of fabricating the structure of FIG. 1 has been shown. Characteristically, the chip package may include 2 or 3 different dielectrics, with the frame 6, the filler 16 being the same or different polymers or fiber reinforced polymers, and the dielectric surrounding the pillars 26 being a third dielectric.

It will be appreciated that the structure shown in FIG. 6(*u*), as resulting from the method of FIG. 3, may be modified such that the layer of Cu pillars comprises a Grid Array of pads that serve as contact in the form of BGA (Ball Grid Array). In such embodiments, as shown in FIG. 2, the outer surface of the Cu pillars 120 122, 124, may be flush with the surrounding dielectric 126, or may be recessed by as much as 10 microns from the surface of the surrounding dielectric 126. Pillars for BGA are typically cylindrical with round ends for ease of wetting by the solder balls.

When configured as a ball grid array, the ends of the pillars are typically coated with OSP 130 (Organic Solderability Preservative).

Thus by virtue of computer imaging and laser writing of the photoresist, the embedded chip package processing route variation described herein is optimal for high end applications.

Furthermore, the time lost in the stepwise though highly automated laser writing step is largely compensated for by the reduced quality control requirements.

Essentially, after applying a layer of photoresist, each and every chip is imaged in its socket through the photoresist, or the position and orientation of each chip is mapped prior to applying the photoresist using registration markers for subsequently writing routing lines that start at the correct position with a laser. Indeed, to overcome the chip dimension variation, by mapping the actual position of each I/O contact with respect to the frame of reference of the socket array, the optimal starting point and end point of each routing trace in the feature layer is determined, and each trace is individually drawn with a laser. In other words, the stenciled patterning of the photoresist using a mask allowing all traces to be patterned simultaneously is sacrificed to allow each and every routing line to be individually plotted. One end of the routing line is accurately positioned to the actual I/O termination of the chip and centered therewith, and the routing line is drawn to avoid other routing lines. However, rather than blindly copying the routing line of a standard solution, assuming optimal alignment between chip and socket, and merely shifting the routing line so that all routing lines of all dies in the array look the same, but are registered with the die rather than with the socket, the correct position of the termination end of the routing layer is determined with respect to the socket frame and the routing line is drawn to this position for subsequent depositing of the termination thereover. In this manner, the reliability of complex, state of the art embedded chip packages is maximized for chips with high contact density, and yields are maximized. The terminations may be patterned in a subsequent layer of photoresist by patterning using a mask or with a laser. Generally, the mask solution will be more efficient. The resolutions of both options is similar.

Although illustrated herein with respect to fabrication of the very simple embedded chip package previously disclosed in U.S. Ser. No. 14/789,165, it will be appreciated that laser writing may be used for patterning routing lines for reliably coupling elements in one layer that are at a less than optimum position, with points on a subsequent layer that are positioned optimally for subsequent coupling. Thus the processing route and structures described herein may be modified for processing more complicated, e.g. multilayer chip packaging solutions.

Thus, laser writing of routing layers may be used to address the issue misalignment of chips with respect to their packaging in embedded packages, enabling correct alignment of the package terminations with respect to the edges and sides of the chip package.

Persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed is:

1. An embedded die package comprising a die having I/O contact pads in a passivation layer, the die contact pads being coupled to a first side of a feature layer by an adhesion/barrier layer, and a layer of pillars extending from a second side of the feature layer, the die, feature layer and the layer of pillars being encapsulated by a dielectric material wherein the feature layer comprises routing lines that are individually drawn for approximate alignment with the I/O contact pads of the die and with pillars.

2. The embedded die package of claim 1 wherein the die is misaligned with sides and edges of the package by more than acceptable tolerances for subsequent reliable deposition of routing lines by stencil exposure of a photoresist.

3. The embedded die package of claim 2 wherein sides of the die are angled to sides of the package by an angle of several degrees.

4. The embedded die package of claim 2 wherein one pair of sides of the die are displaced by 3 to 8 microns from a symmetrical position with regards to one pair of parallel sides of the package.

5. The embedded die package of claim 2 wherein each of two pairs of sides of the die are displaced by 3 to 8 microns from a symmetrical position with regards to each of two pairs pair of parallel sides of the package.

6. The embedded die package of claim 1 wherein the die contact pads comprise aluminum.

7. The embedded die package of claim 6 wherein the passivation layer comprises either polyimide (PI) or SiN.

8. The embedded die package of claim 1 wherein the adhesion/barrier layer is selected from the group consisting of Ti/Cu, Ti/W/Cu and Ti/Ta/Cu.

9. The embedded die package of claim 8 wherein the adhesion/barrier layer has a thickness in the range of from 0.05 micron to 1 micron.

10. The embedded die package of claim 1 wherein the feature layer comprises copper.

11. The embedded die package of claim 10 wherein the feature layer has a thickness in the range of from 1 micron to 25 micron.

12. The embedded die package of claim 10 wherein the layer of pillars has a height in the range of 15 microns to 50 microns.

13. The embedded die package of claim 1 wherein the feature layer has a fan-out form.

14. The embedded die package of claim 1 wherein the feature layer has a fan-in form.

15. The embedded die package of claim 1 wherein said chip and said layer of pillars are embedded in different polymer dielectric materials.

16. The embedded die package of claim 1 wherein said layer of pillars comprises a grid array of pillars that serve as contacts for coupling the die to a substrate.

17. The embedded die package of claim 16 wherein the substrate is a printed circuit board (PCB).

18. The embedded die package of claim 16 wherein the substrate is a Package for fabricating a Package on Package.

19. The embedded die package of claim 16 wherein the grid array of pillars extends up to 10 microns beyond the dielectric or are flush with the dielectric thereby providing land grid array (LGA) pads.

20. The embedded die package of claim 19 wherein the grid array of pillars are terminated with a termination selected from the group consisting of Electrolytic Ni/Au, electroless nickel/immersion gold (ENIG) or electroless nickel/electroless palladium/immersion gold (ENEIG).

21. The embedded die package of claim 16 wherein the grid array of pillars is recessed below the dielectric by up to 10 microns, or are flush with the dielectric, thereby providing ball grid array (BGA) pads.

22. The embedded die package of claim 21 wherein the grid array of posts are terminated with an Organic Solderability Preservative OSP.

23. The embedded die package of claim 1 formed by the method of:
   a. Obtaining a grid of sockets surrounded by a polymer frame;
   b. Placing the grid of chip sockets on a tape;
   c. Placing chips face down (flip chip) in the sockets of the grid;
   d. Laminating a dielectric material over the dies and the grid;
   e. Applying a carrier over the dielectric;
   f. Removing the tape to expose contacts of the chips;
   g. Depositing an adhesive layer comprising at least one of titanium, tantalum, tungsten, chrome and/or nickel followed by a seed layer of copper onto newly exposed surface;
   h. Applying a first layer of photoresist and developing a pattern with a feature layer;
   i. Electroplating copper into the pattern to form features;
   j. Stripping away the first layer of photoresist;
   k. Applying a second layer of photoresist patterned with a pattern of via pillars;
   l. Electroplating copper into the pattern to form via pillars;
   m. Stripping away the second layer of photoresist;
   n. Etching away exposed portions of the adhesive layer and the copper seed layer;
   o. Applying a dielectric barrier layer covering the copper features, pillars and undersides of the chips;
   p. Thinning the polymer to expose the frame;
   q. Removing carrier;
   r. Laminating a thin layer of dark dielectric over the back of the array of dies;
   s. Thinning the dielectric to expose the copper pillars;
   t. Applying terminations, and
   u. Dicing the grid into individual packaged chips.

24. The method of claim 23 wherein an array of chips is positioned within each socket.

25. The method of claim 23 wherein a wafer with an array of chips thereon is positioned within each socket.

26. The method of claim 23 wherein the copper pillars comprise a LGA (Land Grid Array) and are characterized by at least one of the following limitations:
   Square or rectangular shape;
   Outer surface being plated with a final metal plating comprising Electroless Nickel/Electroless Palladium/Immersion Gold (ENEPIG), Electroless Nickel/Immersion Gold (ENIG) or Electrolytic Nickel and Gold (Ni/Au) termination techniques, and
   Optionally protruding by up to 10 microns from the surrounding dielectric.

27. The method of claim 23 wherein the copper pillars comprise a BGA (Ball Grid Array) of pads characterized by at least one of:
   Being recessed by up to 10 microns with respect to surrounding dielectric;
   Having cylindrical shape with circular ends for ease of wetting by solder balls; and
   Being coated with OSP (Organic Solderability Preservative).

28. A multilayer interposer for coupling a chip to a circuit, wherein a routing layer connects pillars of an adjacent layer aligned with an array of I/O contacts of the chip on one side of the routing layer, and pillars aligned with an array of terminations for coupling to the circuit.

29. The multilayer interposer of claim 28 further comprising a limitation selected from the group comprising:
   the array of terminations being a ball grid array;
   the array of terminations being a land grid array;
   the routing layer comprising copper routing lines fabricated by electroplating into a patterned photoresist selectively exposed by a laser.

30. A chip package for packaging a chip for coupling to a circuit, wherein a routing layer connects pillars of an adjacent layer aligned with an array of I/O contacts of the chip on one side of the routing layer, and pillars aligned with an array of terminations for coupling to the circuit.

31. The chip package of claim 30 further comprising a limitation selected from the group consisting of:
   the array of terminations being a ball grid array;
   the array of terminations being a land grid array;
   the routing layer comprising copper routing lines fabricated by electroplating into a patterned photoresist selectively exposed by a laser.

* * * * *